(12) United States Patent  
Macpherson

(10) Patent No.: US 8,169,748 B2
(45) Date of Patent: May 1, 2012

(54) DAMPING MEMBER FOR A MOVEABLE FLEX CIRCUIT

(75) Inventor: Aaron Steve Macpherson, Fort Collins, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 765 days.

(21) Appl. No.: 12/246,368

(22) Filed: Oct. 6, 2008

(65) Prior Publication Data

US 2010/0085665 A1    Apr. 8, 2010

(51) Int. Cl.
*G11B 5/55* (2006.01)

(52) U.S. Cl. .................................... 360/264.2
(58) Field of Classification Search ............... 360/264.2
See application file for complete search history.

(56) References Cited

U.S. PATENT DOCUMENTS

| | | |
|---|---|---|
| 4,144,929 A | 3/1979 | French et al. |
| 4,218,714 A | 8/1980 | Isozaki et al. |
| 4,734,804 A | 3/1988 | Hanabusa |
| 5,012,370 A | 4/1991 | Hikichi et al. |
| 5,163,038 A | 11/1992 | Arai |
| 5,491,598 A | 2/1996 | Stricklin et al. |
| 5,725,931 A | 3/1998 | Landin et al. |
| 5,757,580 A | 5/1998 | Andress et al. |
| 5,777,821 A | 7/1998 | Pottebaum |
| 5,805,387 A | 9/1998 | Koester |
| 5,907,452 A | 5/1999 | Kan |
| 6,078,498 A | 6/2000 | Eckerd et al. |
| 6,091,574 A | 7/2000 | Misso |
| 6,175,469 B1 | 1/2001 | Ahmad et al. |
| 6,377,420 B1 | 4/2002 | Tadepalli et al. |
| 6,487,039 B1 | 11/2002 | Bernett |
| 6,536,555 B1 | 3/2003 | Kelsic et al. |
| 6,594,114 B1 | 7/2003 | Suzuki et al. |
| 6,603,633 B2 | 8/2003 | Heaton et al. |
| 6,608,732 B2 | 8/2003 | Bernett et al. |
| 6,711,117 B1 | 3/2004 | Kanbe |
| 6,724,566 B2 | 4/2004 | Kant et al. |
| 6,735,043 B2 | 5/2004 | Bernett et al. |
| 6,898,051 B2 | 5/2005 | Bahirat et al. |
| 6,937,442 B2 | 8/2005 | Zhao et al. |
| 7,199,970 B2 | 4/2007 | Boss et al. |
| 2004/0264058 A1* | 12/2004 | Huynh ............... 360/264.2 |
| 2006/0276058 A1 | 12/2006 | Freeman et al. |
| 2007/0153426 A1* | 7/2007 | Izumi et al. ......... 360/264.2 |

* cited by examiner

*Primary Examiner* — David D Davis
(74) *Attorney, Agent, or Firm* — Hall Estill Attorneys at Law

(57) ABSTRACT

Method and apparatus for attenuating resonances in a flex circuit which interconnects a stationary element and a moveable element, such as a connector and a head stack assembly (HSA) in a data storage device. An intermediary portion of the flex circuit forms a dynamic loop between the stationary element and the moveable element. A damper member is attached to the flex circuit so as to continuously extend adjacent the stationary element and along less than an overall extent of the dynamic loop. The damper member attenuates resonances excited in the flex circuit during movement of the moveable element.

15 Claims, 3 Drawing Sheets

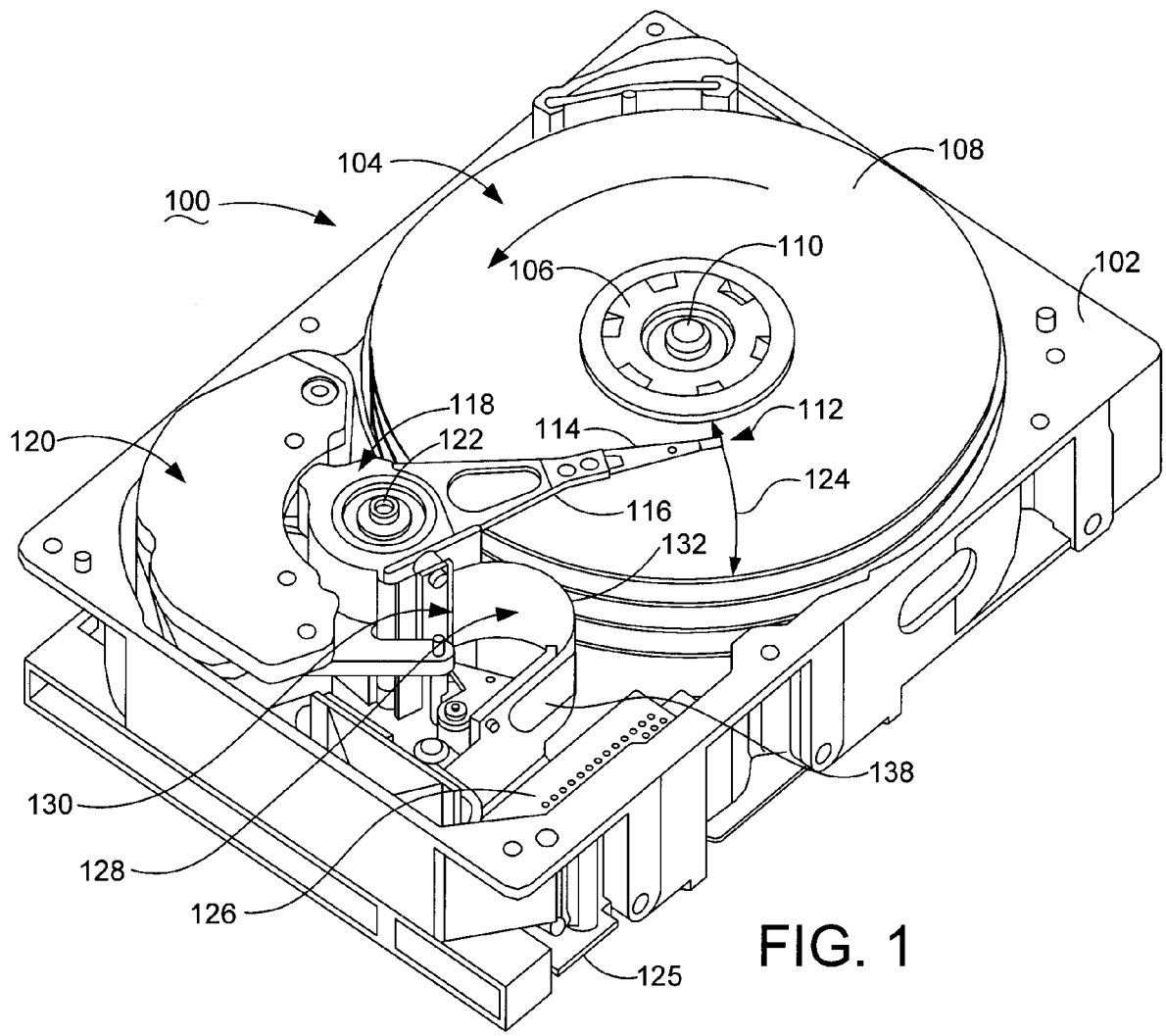
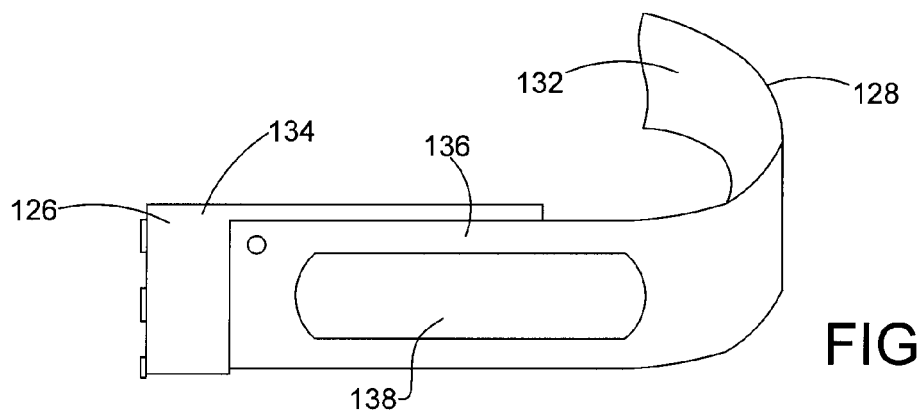
FIG. 1
FIG. 2

DAMPING MEMBER FOR A MOVEABLE FLEX CIRCUIT

BACKGROUND

Data storage devices store and retrieve large amounts of data in a fast and efficient manner. A disc drive is a type of data storage device that often includes one or more data storage discs spun by a spindle motor at a constant high rotational speed.

Data storage and retrieval from the disc surfaces is effected by a rotary actuator assembly (sometimes referred to as a head stack assembly, or HSA). The HSA supports a number of data transducing heads that are controllably moved across the disc surfaces by an actuator motor (sometimes referred to as a voice coil motor, or VCM).

The spindle motor and the HSA are typically mounted to a base deck that cooperates with a top cover to provide a protected interior environment for the discs and heads. A printed circuit cable (PCC) provides the requisite electrical communication paths between the HSA and a data storage device printed circuit board (PCB) mounted to the exterior of the base deck. The PCB supports communication and control electronics for operation and control of the device.

The PCC includes a flex cable that has a flexible, laminated member that electrically isolates and supports a number of embedded electrical conductor paths along the length of the laminated member. Generally, one end of the flex cable is coupled to the PCB and the other end of the flex cable is coupled to the HSA.

An intermediary portion of the flex cable can operate as a dynamic loop (slack loop) that provides strain relief while the HSA moves the heads radially in close proximity to the disc surfaces. In practice, the flex cable loop can often act like a spring, exerting bias forces on the HSA as the slider heads are moved to different radial positions with respect to the disc surfaces. Resonances in the flex cable can also be induced during seek operations when the HSA moves a selected head from an initial track to a destination track. Various embodiments of the present invention are generally directed to an apparatus and method for attenuating resonances in a flex circuit, such as in a data storage device.

SUMMARY

In accordance with various embodiments, the flex circuit interconnects a stationary element and a moveable element, such as a connector and a head stack assembly (HSA). An intermediary portion of the flex circuit forms a dynamic loop between the stationary element and the moveable element.

A damper member is attached to the flex circuit so as to continuously extend adjacent the stationary element and along less than an overall extent of the dynamic loop. The damper member attenuates resonances excited in the flex circuit during movement of the moveable element.

These and various other features and advances which characterize various embodiments of the present invention will become apparent upon reading the following detailed description and upon reviewing the associated drawings.

BRIEF DESCRIPTION OF THE DRAWINGS

FIG. 1 is an isometric view of a data storage device constructed in accordance with various embodiments of the present invention, wherein a cover member of the device has been removed in FIG. 1 to reveal various components of interest.

FIG. 2 is an elevational view of a portion of a printed circuit cable (PCC) of FIG. 1 showing an attached damper member.

DESCRIPTION

Figure 3:
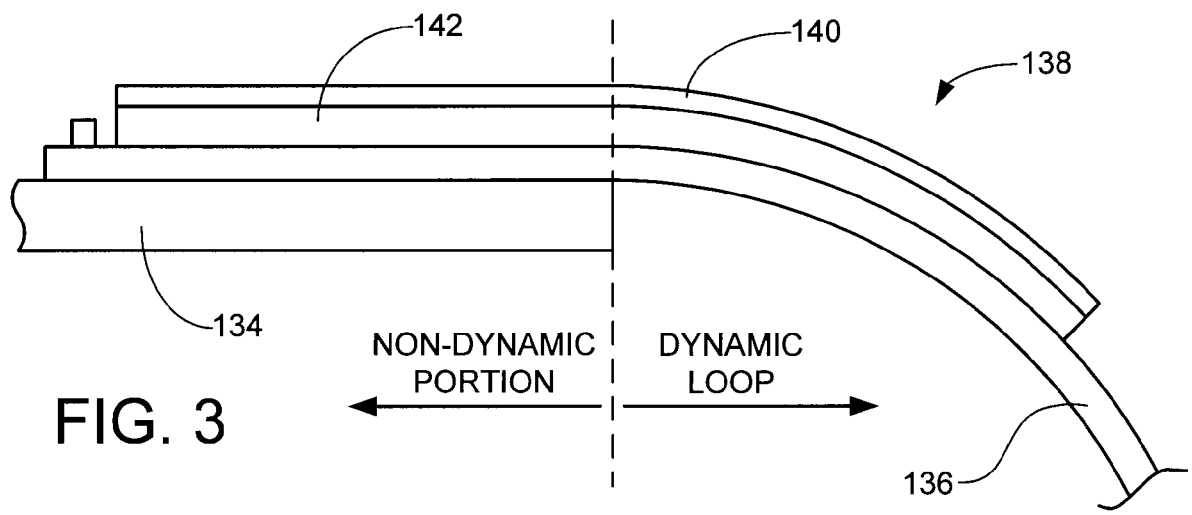
FIG. 3 is a side view of the damper member in accordance with some embodiments.

FIG. 1 shows a data storage device 100 constructed in accordance with various embodiments of the present invention. While the data storage device 100 is characterized as a disc drive, such is merely exemplary and not limiting to the scope of the claimed subject matter.

The device 100 includes a housing with a base 102, a top cover (not shown) and a disc stack 104, which is mounted on a spindle motor (not shown) by a disc clamp 106. The disc stack 104 includes one or more individual data discs 108 mounted for rotation about a central axis 110. Each disc 108 has at least one data surface, and for each disc data surface, the data storage device 100 has an associated disc head slider 112 and supported read/write, data transducer head (not separately numbered) for communication with the disc surface.

As depicted in FIG. 1, each of the sliders 112 is supported by a flex arm 114 that in turn is attached to a suspension arm 116 of a head stack assembly (HSA) 118. The HSA 118 shown in FIG. 1 is of the type known as a rotary moving coil actuator and includes a voice coil motor (VCM) 120. The VCM 120 rotates the HSA 118 and attached data transducer heads about a pivot shaft 122 to position the data transducer heads over a desired data track along an arcuate path 124. The VCM 120 is driven by servo electronics of a controller on a printed circuit board (PCB) 125, that is electrically accessed via a bulkhead connector 126.

A flexible printed circuit cable (PCC) 128, also sometimes herein referred to as the flex circuit assembly, runs between the pivot housing of the HSA 118 and the connector 126. A clamp 130 engages the proximal end of the flexible cable 128 and directs the PCC 128 to extend the medial portion 132 of the PCC 128 in the form of a slack loop, as shown. The other end of the PCC 128 attaches to the connector 126.

The slack loop formed by the PCC 128 provides mechanical isolation of the HSA 118 to allow rotary motion of the HSA 118 during accessing operations with minimal mechanical constraint. The loop of the PCC 128 can be subjected to vibration during data seeks, introducing unwanted random transient vibration modes (RTV) to the HSA. These RTV's degrade settling performance of the data storage device. Data storage device performance is measured by track-misregistration (TMR) caused by degradation of positioning control by data storage device component vibration, including the RTV's of the PCC 128. Specifically, the PCC 128 can introduce modes of vibration during data seeks that have identified RTV modes in the frequency range from 300 Hz to 700 Hz, and the unwanted vibration modes of the PCC 128 can be attenuated by placement of damping material in contact with portions of the PCC loop.

Turning to FIG. 2, shown therein is a connector pad 134 of the connector 126, and the end portion 136 of the PCC 128 is attached thereto, with the electrical conductors of the PCC 128 providing electrical communication between the PCB (not shown) and the HSA 118 and thus to the data transducer heads.

Adhered to the end portion 136 is a damper member 138. In some embodiments, the damper member 138 is a constraint layer damper that is made of multiple layers of damping material. It should be noted that the damper member 138 spans along the PCC 128 where the same overlaps the connector pad 134, and the damper member 138 extends beyond the end of the connector pad 134 to span for a determined distance along a portion of the slack loop, or medial portion 132, of the PCC 128.

The damping material layers of the damper member 138 are selected to have similar stiffness, or flexibility, as that of the PCC 128. As the slack loop (the medial portion 132) is flexed with movement of the HSA 118, that portion of the damping material extending beyond the edge of the connector pad 134 is put into shear with a negligible bias force delivered from the damper to the medial portion 132. This is accomplished by having the damper material span both a non-dynamic and a dynamic portion of the slack loop.

The layers of damping material of the damper member 138 are preferably a viscous material that forms the middle layer of a constraint damping system. Basically, the viscous layers are put into shear when the PCC 128 bends, and vibration energy is dissipated in shearing the viscous material. The shearing occurs where the flex circuit (the PCC 128) exits the rigid connector pad 134 up to the extended end of the damper member 138. This is the result of the damper member 138 straddling both a rigid member (the connector pad 134) and a flexible member (the slack loop of the PCC 128). One advantage of this configuration is that the location of the damper member 138 is achieved with negligible impact on the freedom of motion of the slack loop, resulting in lower bias forces upon the HSA 118.

The length, width and volume of the viscous material contained in the damper member 138 should be selected to provide the best compromise between the damping effect and the amount of bias force added to the slack loop. An exemplary construction of the damper member 138 is shown in FIG. 3 to include a suitable flexible, plastic outer layer 140 and a compressible inner layer 142. A suitable material for the outer layer 140 is a flexible film such as Kapton® film, a polyimide film marketed by the E.I. DuPont de Nemours and Company of Wilmington, Del.

A suitable material for the inner layer 142 is 3M 242F02 adhesive, a thin 20 viscoelastic polymer available from vendors handling products of the 3M Company, St. Paul, Minn. The adhesive adheres upon contact, and is protected prior to use with a polyester liner (not shown) that is easily removed for applying the damper member 138 to the PCC 128, as described.

Figure 4A:
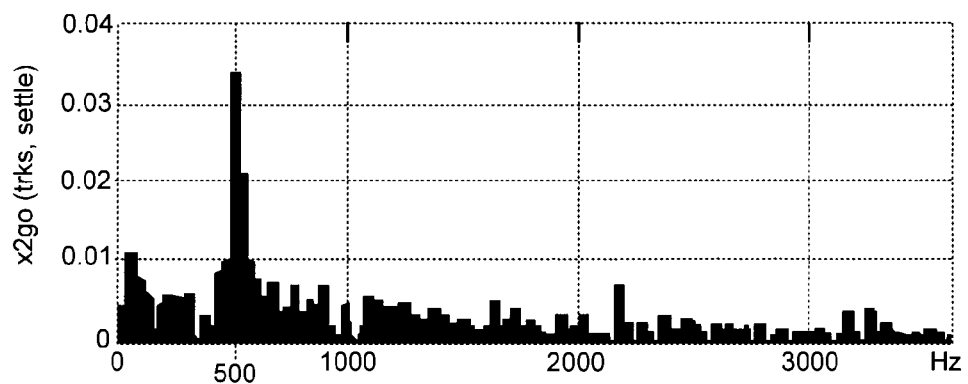
FIGS. 4A and 4B are graphical illustrations of an exemplary reduction of deleterious resonant frequencies accomplished through the use of the damper member of FIG. 2.
Figure 4B:
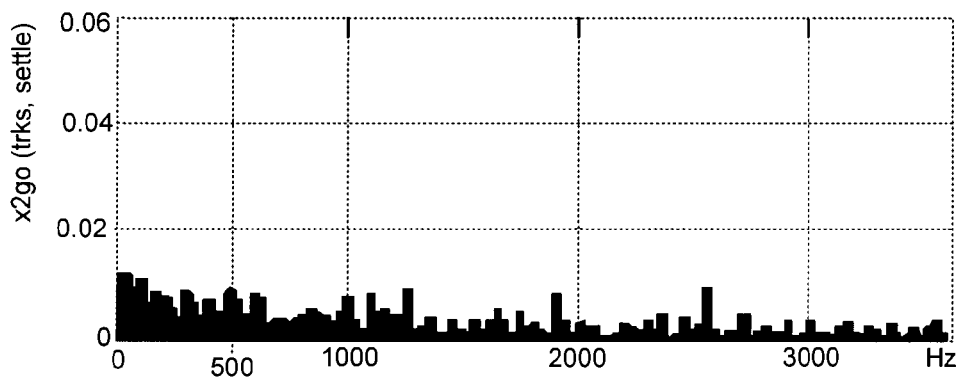

FIGS. 4A and 4B demonstrate the effectiveness of the damper member 138, with the data depicted in FIG. 4A representing performance of a device such as 100 without the damper 138 and the data depicted in FIG. 4B representing the performance of the device with the damper 138. Both FIGS. 4A and 4B show the frequency content that the HSA controller applies when the head arrives on a desired track. In FIG. 4A, a prominent peak at 500 Hz is visible, indicating a problem of lengthy track settlement. It should be noted that this frequency varies from drive to drive, and the range noted in practice is between about 510 Hz and 600 Hz. In FIG. 4B, the damper 138 is shown to have removed this frequency peak. These figures demonstrate the significant reduction of correction required at the 500 Hz level.

Figure 5:
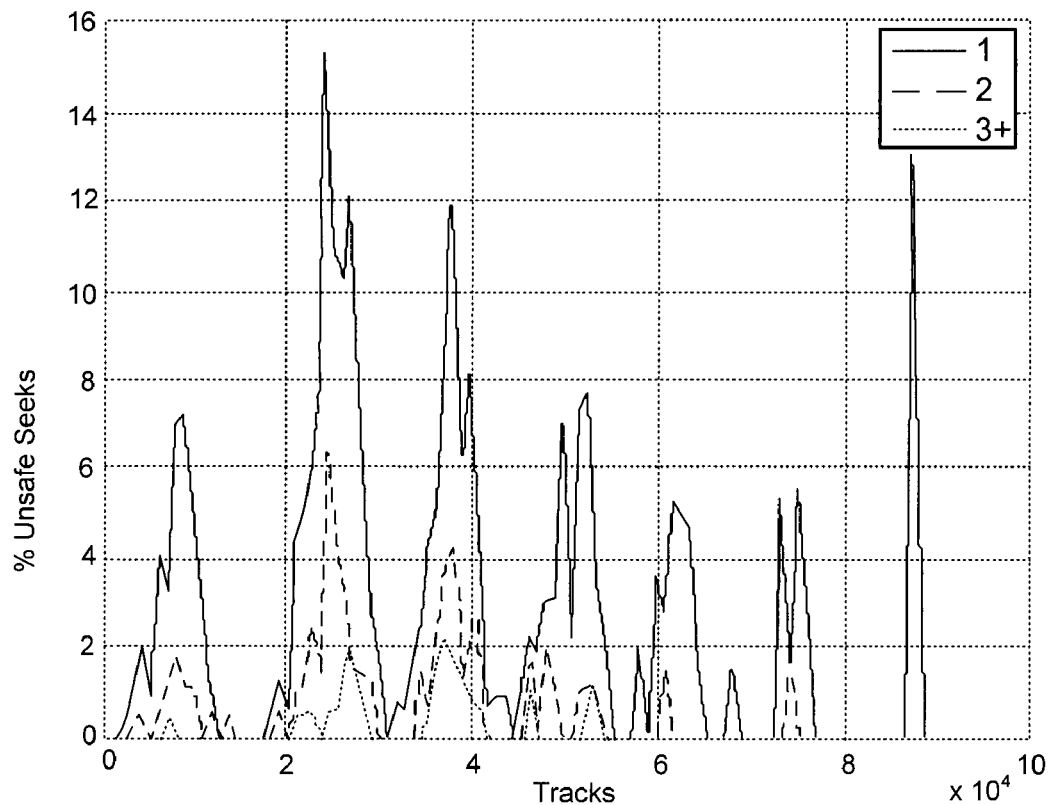
FIGS. 5 and 6 are graphical illustrations of corresponding exemplary reductions in unsafe seeks accomplished through the use of the damper member of FIG. 2.
Figure 6:
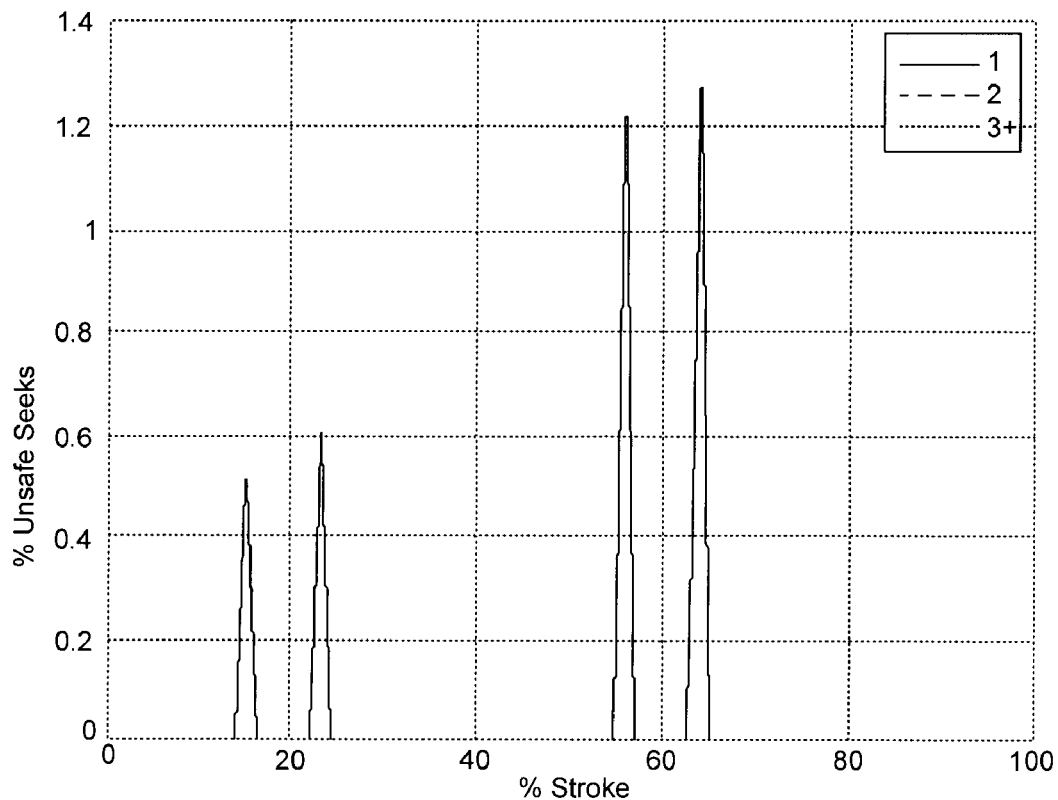

This is further illustrated by FIGS. 5 and 6 that depict another way to illustrate the efficacy of the various embodiments disclosed herein. FIG. 5 generally depicts the device 100 without the damper 138 and the data depicted in FIG. 6 representing the performance of a data drive with the damper 138. In each, the horizontal axis is the length of seek along path 124 (FIG. 1), and the vertical axis is the percentage of those seeks that lie outside an arrival time window within which it is safe for data write operations to commence. This safe window is required to prevent the writing head from erasing tracks adjacent to the desired track.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application of the damping member without departing from the spirit and scope of the present invention.

In addition, although the embodiments described herein are generally directed to a printed circuit cable in a disc drive data storage device, it will be appreciated by those skilled in the art that the damping member of the present invention can be used for other types of systems without departing from the spirit and scope of the claimed invention.

What is claimed is:

1. An apparatus, comprising:
   a flex circuit which interconnects a stationary element and a moveable element, an intermediary portion of the flex circuit forming a dynamic loop between the stationary element and the moveable element; and
   a damper member attached to the flex circuit so as to continuously extend adjacent the stationary element and along less than an overall extent of the dynamic loop, the damper member comprising a flexible outer layer and a compressive inner layer disposed between the flex circuit and the outer layer, the outer layer being free to move relative to the stationary member and the inner layer being placed into shear in a direction along the dynamic loop to provide constraint layer damping of the flex circuit to attenuate resonances excited in the flex circuit during movement of the moveable element.

2. The apparatus of claim 1, wherein the flex circuit transitions from the dynamic loop to a non-dynamic portion adjacent the stationary element, and wherein the damper member continuously extends along the non-dynamic portion, across said transition, and along a portion of the dynamic loop.

3. The apparatus of claim 1, wherein the flex circuit is formed of a first flexible material, and wherein the outer layer of the damper member is formed of said first flexible material.

4. The apparatus of claim 1, wherein the flex circuit is formed of a first flexible material, and wherein the outer layer of the damper member is formed of a different, second flexible material.

5. The apparatus of claim 1, wherein the damper member outer layer is an elastic polymer layer and the damper member inner layer is formed of a viscous adhesive.

6. The apparatus of claim 1, wherein the stationary element comprises a bulkhead connector, wherein the moveable element comprises a head stack assembly which supports a transducer adjacent a rotatable storage medium, and wherein the flex circuit supports at least one electrically conductive trace which interconnects the connector with the head stack assembly.

7. The apparatus of claim 1, wherein the flex circuit has a flex length dimension in a direction from the stationary element to the moveable element and a flex width dimension normal to the length dimension, and wherein the damper member is substantially rectangular with a damper length dimension oriented along the flex length dimension and a damper width dimension oriented along the flex width dimension, wherein the damper length dimension is less than the flex length dimension, and wherein the damper width dimension is less than the flex width dimension.

8. The apparatus of claim 1, wherein the flex circuit is characterized as a flex circuit of a data storage device.

9. A method comprising:
attaching a damper member to a flex circuit interconnecting a stationary element and a moveable element, an intermediary portion of the flex circuit forming a dynamic loop between the stationary element and the moveable element, the flex circuit transitioning from the dynamic loop to a non-dynamic portion of the flex circuit supported by the stationary element, the damper member continuously extending along the non-dynamic portion across said transition and along a portion of the dynamic loop, the damper member having a flexible outer layer and a compressive inner layer, the inner layer disposed between the flex circuit and the outer layer, the outer layer mechanically decoupled from the stationary element; and
moving the moveable element, wherein the damper member provides constraint layer damping of the flex circuit by placing the inner layer into shear while the outer layer moves relative to the stationary element to dissipate vibration energy in the flex circuit during movement of the moveable element.

10. The method of claim 9, wherein the damper has an overall length in a direction along the flex circuit and toward the moveable element, the damper having a first portion of said overall length adjacent the non-dynamic portion of the flex circuit that is longer than a second, remaining portion of said overall length adjacent the dynamic portion of the flex circuit.

11. The method of claim 9, wherein the dynamic portion of the flex circuit curvilinearly extends along a selected radius so that an inner facing surface of the flex circuit takes a concave shape and an opposing outer facing surface of the flex circuit takes a convex shape, the damping member affixed to said outer facing surface of the flex circuit.

12. The method of claim 9, wherein the damper member outer layer is an elastic polymer layer and the damper member inner layer is formed of a viscous adhesive.

13. The method of claim 9, wherein the stationary element comprises a bulkhead connector, wherein the moveable element comprises a head stack assembly which supports a transducer adjacent a rotatable storage medium, and wherein the flex circuit supports at least one electrically conductive trace which interconnects the connector with the head stack assembly.

14. The method of claim 9, wherein the flex circuit has a flex length dimension in a direction from the connector to the moveable element and a flex width dimension normal to the length dimension, and wherein the damper member is substantially rectangular with a damper length dimension oriented along the flex length dimension and a damper width dimension oriented along the flex width dimension, wherein the damper length dimension is less than the flex length dimension, and wherein the damper width dimension is less than the flex width dimension.

15. The method of claim 9, wherein the flex circuit is characterized as a flex circuit of a data storage device.

\* \* \* \* \*